United States Patent [19]

Geyling

[11] Patent Number: 5,178,840
[45] Date of Patent: Jan. 12, 1993

[54] SINGLE WAFER REGROWTH OF SILICON

[75] Inventor: Franz T. Geyling, Austin, Tex.

[73] Assignee: Sematech, Inc., Austin, Tex.

[21] Appl. No.: 849,783

[22] Filed: Mar. 10, 1992

Related U.S. Application Data

[63] Continuation of Ser. No. 638,775, Jan. 8, 1991, abandoned.

[51] Int. Cl.[5] ............................................. B01D 9/00
[52] U.S. Cl. ............................... 422/247; 156/620.7; 156/620.71; 156/620.72; 156/DIG. 64; 156/DIG. 98; 156/DIG. 102; 422/251; 422/253
[58] Field of Search ........... 156/620.7, 620.71, 620.72, 156/DIG. 64, DIG. 98, DIG. 102; 422/247, 251, 253

[56] References Cited

U.S. PATENT DOCUMENTS

| | | | |
|---|---|---|---|
| 2,852,351 | 9/1958 | Pfann | 23/309 |
| 2,926,075 | 2/1960 | Pfann | 23/301 |
| 3,865,564 | 2/1975 | Jaeger et al. | 65/2 |
| 4,343,829 | 8/1982 | Tochikubo et al. | 156/DIG. 102 |
| 4,488,930 | 12/1984 | Koe | 156/620.71 |
| 4,561,486 | 12/1985 | Maeda et al. | 156/DIG. 64 |
| 4,731,516 | 3/1988 | Noguchi et al. | 156/643 |

FOREIGN PATENT DOCUMENTS

| | | | |
|---|---|---|---|
| 3608783 | 9/1987 | Japan | 422/247 |
| 1051614 | 2/1989 | Japan | 156/620.7 |

OTHER PUBLICATIONS

VLSI Technology S. M. Sze, "Crystal Growth and Wafer Preparation," C. W. Pearce, McGraw Hill, 1988.
J. Appl. Phys. 63(8) pp. 2660–2668 "Role of impurities in zone melting recrystallization of the 10 $\mu m$ thick polycrystalline silicon films", Mertens et al., Apr. 15, 1988.
Appl. Phys. Oct. 1, 1981, pp. 561–563 "Improved techniques for growth of large-area single-crystal Si sheets over $SiO_2$ using lateral epitaxy by seeded solidification", Tsaur et al.
Zone Melting William G. Pfann; John Wiley and Sons; New York; 1958 and 1966.

Primary Examiner—Olik Chaudhuri
Assistant Examiner—Felisa Garrett
Attorney, Agent, or Firm—William W. Kidd

[57] ABSTRACT

A wafer chuck is used to support a circular silicon wafer, which was formed from a single wafer casting process, in order to perform monocrystalline silicon regrowth. The cast wafer, having a monocrystalline silicon seed, located at its center, rests atop raised portions of the chuck and is held in place by vaccum at the center and the perimeter. The rest of the underside of the wafer is physically separated from the chuck surface by pressurized gas. An annular laser beam is then used to melt the silicon from the seed outward to grow the wafer into a monocrystalline form.

3 Claims, 3 Drawing Sheets

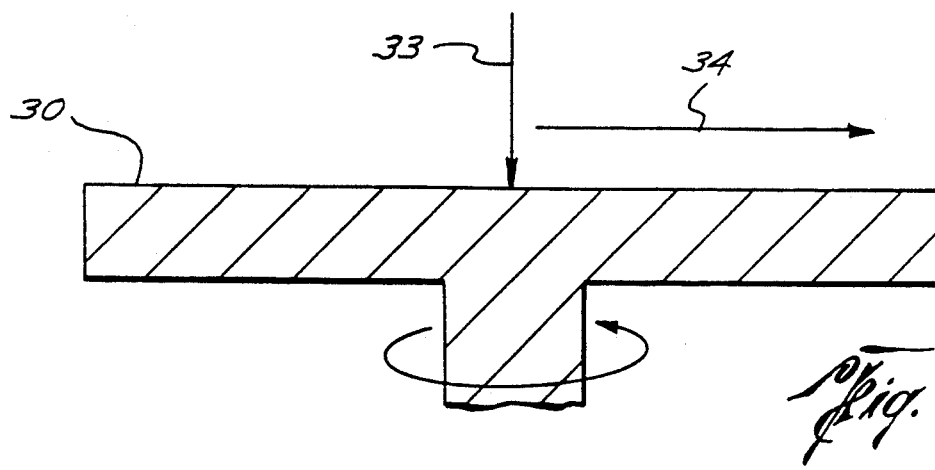
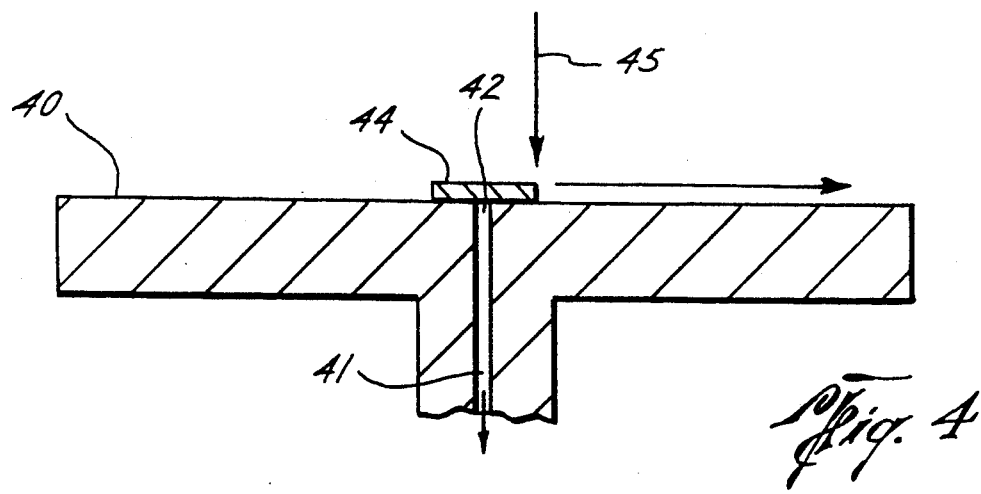
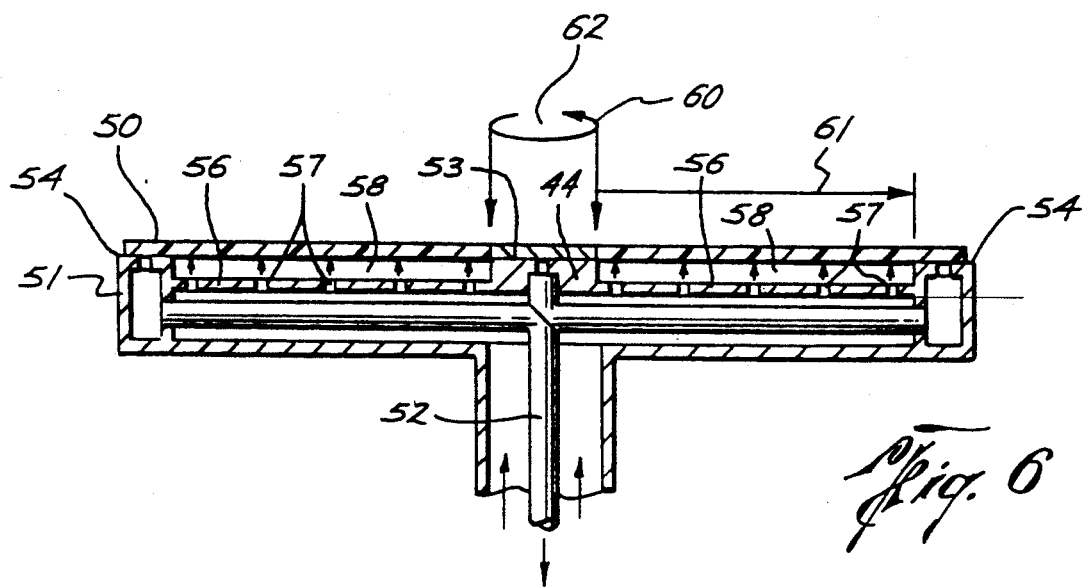

SINGLE WAFER REGROWTH OF SILICON

This application is a continuation of application Ser. No. 638,775, filed Jan. 1, 1991, now abandoned.

BACKGROUND OF THE INVENTION

1. Field of the Invention

The present invention relates to the field of semiconductor manufacturing techniques and, more particularly, to a method and apparatus for manufacturing a silicon semiconductor wafer.

2. Related Application

This application is related to application Ser. No. 638,893; filed Jan. 8, 1991, and entitled Spin Casting of Silicon Wafers now U.S. Pat. No. 5,161,717.

3. Prior Art

The present semiconductor integrated circuit technology is based predominantly on the element silicon. Silicon-based devices account for a significantly large percentage of semiconductor devices manufactured. One well-known technique of fabricating silicon based integrated circuits involves what is commonly referred to as the metal-oxide-semiconductor (MOS) technology. In the practice of MOS technology, silicon is used as a base substrate, wherein doped regions are formed in the substrate and various layers and lines are formed overlying the substrate to fabricate an integrated circuit "chip".

In a typical semiconductor integrated circuit fabrication process, devices are constructed onto a preformed silicon wafer. These wafers are typically flat and circular in shape. The diameter of the wafers vary from approximately four (4) inches to eight (8) inches. By utilizing a number of various processing techniques, which may include doping, implanting, depositing, etching, to name a few, a number of completed chips are formed on a silicon wafer. Subsequently, the wafer is cut to separate each independent chip and packaged for use.

The semiconductor technology has evolved and continues to evolve to reduce the size of each transistor formed on the substrate. The reduction of the dimensional geometry of the transistor, as well as the lines interconnecting the transistors, has permitted more devices to be fabricated per unit area on the silicon wafer. Furthermore, equipment and process technologies have evolved to permit larger diameter wafers to be fabricated in order to increase the number of chips which can be manufactured on a given wafer.

Although the silicon semiconductor technology has evolved significantly since its inception, the technique for the manufacturing of the silicon wafer itself has not evolved appreciably in comparison. Substantially all of present day silicon semiconductor wafers are manufactured by a well-known crystal growing technique commonly referred to as the Czochralski (CZ) technique. The CZ technique, developed as early as the 1920's, is still the preferred technique today.

The CZ process utilizes an apparatus having a crucible in which chunks of high-purity polysilicon material is placed. An attendant heater melts the silicon material such that the liquid form of the silicon is contained in the crucible. Subsequently, an elongated shaft, which contains a seed crystal, is lowered into the crucible. Typically, the seed is comprised of a monocrystalline silicon material which is used to grow the monocrystalline silicon from the liquid polysilicon. Under a finely controlled process, the shaft is slowly raised. As the shaft is raised out of the crucible, the liquid polysilicon adheres to the shaft and is also pulled upward out of the crucible. As the liquid silicon cools and hardens, the process provides for the crystallization of the silicon being drawn upward and outward from the crucible. Due to the presence of the monosilicon seed, monocrystalline crystal growth occurs as the silicon material is pulled out of the crucible. When the crystal growing process is completed, a solid cylinder of monocrystalline silicon is obtained. Then, this cylinder of silicon is cut and formed to provide a number of given diameter silicon wafers. The CZ technique is well-known in the prior art and is described in detail in *VLSI Technology*; S. M. Sze, McGraw Hill, 1988, particularly in Chapter 1, entitled "Crystal Growth and Wafer Preparation" by C. W. Pearce.

Although the CZ technique is an adequate technique for the production of silicon wafers, it is a batch process. Further, it has a number of disadvantages which makes this CZ method somewhat inefficient. For example, a significant amount of processing time is required to grow the crystal onto the shaft which is pulled upward and outward from the crucible in a controlled environment. A typical processing time is approximately one to two days to grow a cylinder of silicon having a length of one meter and a diameter of 200 mm or more. The subsequent cutting of the silicon cylinder also adds processing time. This cutting of the silicon cylinder requires a specialized cutting tool and typically results in more than fifty percent of the material being wasted.

Accordingly, it is appreciated that an improved technique of manufacturing silicon wafers over the Czochralski method is desired. The present invention overcomes many of the disadvantages of the prior art CZ technique and provides for a casting of a single silicon wafer instead of the batch manufacturing process of the CZ technique.

SUMMARY OF THE INVENTION

An apparatus for casting a single silicon wafer and regrowth of silicon crystal is described. An apparatus for casting a single silicon wafer, comprising a quartz drum having a slotted opening, pours measured amounts of granulated or powdered silicon into a quartz crucible. Flash heaters disposed about the crucible then melt the solid silicon to provide a pool of molten silicon in the crucible. When a predetermined level of molten silicon is reached, the dispenser opening is rotated to its closed position. Utilizing controlled gas pressure the molten silicon is poured from the crucible onto a rotating wafer chuck in order to form a single silicon wafer. The crucible has a U-shaped tube at the bottom in which a reservoir of molten silicon remains to isolate the interior of the crucible from the ambient environment of the chamber.

In one technique, a wafer chuck, having centrally resident thereon a monocrystalline silicon seed, is used for casting the wafer. The molten silicon is ejected from the crucible by pressure-controlled gas to pour the silicon onto the casting chuck outward from the seed. After solidification, the wafer is heated to regrow a monocrystalline structure from the seed.

In the preferred technique, the cast wafer is placed on a specialized quartz chuck for performing the regrowth. The seed and the edge of the cast wafer rests atop a raised portion of the chuck and are held on to this second chuck by vacuum. The rest of the underside of the wafer is physically separated from the chuck surface by pressurized gas which is forced through openings disposed on the upper surface of the chuck. An annular laser beam is then used to melt a ring of silicon from the seed outward to regrow the material into a monocrystalline form. The pressure-controlled gas prevents the molten silicon from sagging below the wafer plane.

BRIEF DESCRIPTION OF THE DRAWINGS

FIG. 3 is a cross-sectional drawing of the chuck of FIG. 2 used for the pouring of molten silicon.

FIG. 4 shows a vacuum chuck of the present invention for use with a monocrystalline silicon seed to cast a single silicon wafer.

FIG. 6 is a cross-sectional diagram of another wafer chuck of the present invention in which a hardened silicon wafer cast, utilizing the chuck of FIG. 3, is then heated on this chuck to alter the crystalline form of the silicon to that of the monocrystalline seed.

DETAILED DESCRIPTION OF THE PREFERRED EMBODIMENT

An apparatus and a method for manufacturing a single silicon wafer for use in semiconductor fabrication is described. In the following description, numerous specific details are set forth, such as specific shapes, materials, processes, etc., in order to provide a thorough understanding of the present invention. However, it will be obvious to one skilled in the art that the present invention may be practiced without these specific details. In other instances, wellknown processes and structures have not been described in detail in order not to unnecessarily obscure the present invention.

Wafer Casting

Figure 1:
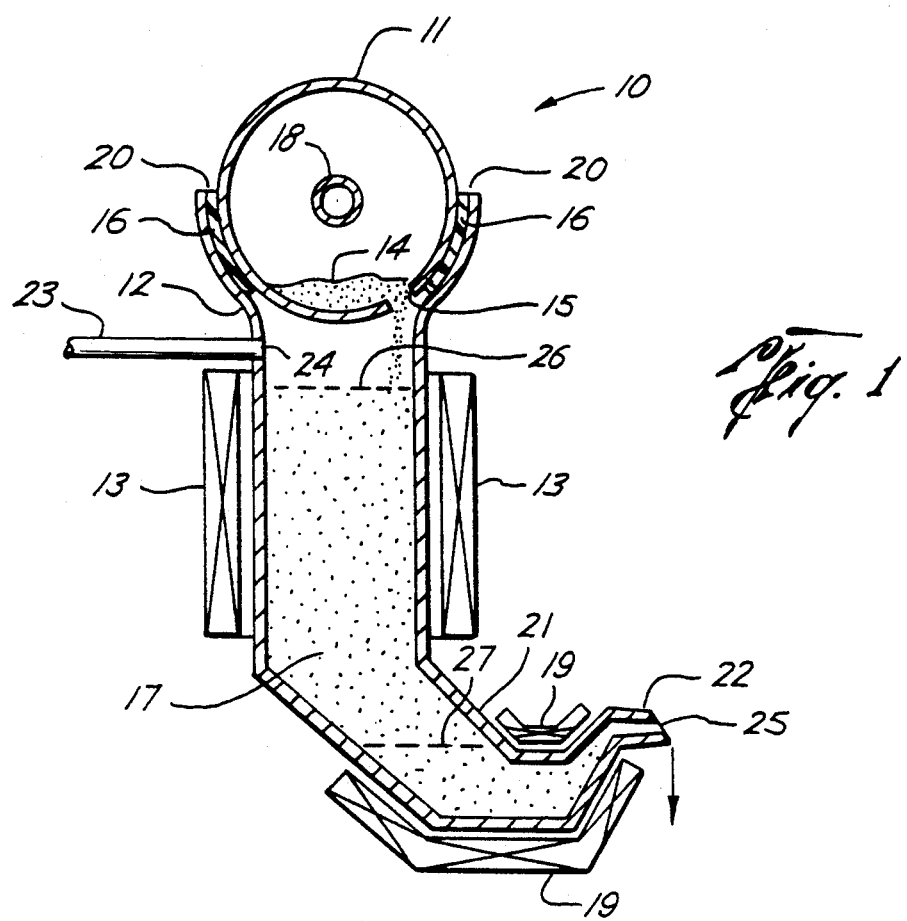
FIG. 1 shows an apparatus of the present invention for feeding silicon granules to a crucible and subsequent pouring of molten silicon from the crucible.

Referring to FIG. 1, an apparatus 10 of the present invention for pouring molten silicon to cast a single wafer is illustrated. Apparatus 10 is basically comprised of a rotary dispenser (drum) 11, crucible 12 and heater 13. The rotary dispenser 11 of the apparatus 10 is a cylindrically shaped quartz drum utilized for the dispensing of powdered or granulated silicon 14 which is contained therein. The purpose of drum 11 is to provide a container for storing the powdered or granulated silicon 14 and dispensing the silicon 14 into crucible 12. A slotted opening 15 of drum 11 allows controlled amounts of the powdered silicon 14 to be dispensed into crucible 12 when the drum 11 is rotated and opening 15 is exposed. Drum 11 of the preferred embodiment is a quartz drum, quartz being a wellknown material for use as a container for silicon. Drum 11 is cylindrical in shape having flat ends, however, it is to be noted that the actual shape of the dispenser is a design choice.

The crucible 12 of the preferred embodiment is a vertically elongated container having an expanded flanged opening 20 at its upper end and a U-shaped tubular structure (U-tube) 21 at its lower end. This U-tube 21 has a casting nozzle 22 which provides for an opening 25 as a spout end of the crucible 12. In the design of the crucible 12, the spout opening 25 at the casting nozzle 22 is disposed at a position slightly higher than the lower most portion of U-tube 21 when crucible 12 is standing vertically. Crucible 12 of the present invention is constructed from quartz. Quartzware is typically preferred due to its ability to withstand the higher temperatures encountered in housing molten silicon and, at the same time, not interacting with and contaminating the molten silicon.

The heater 13 is disposed along the vertical section of crucible 12 for the purpose of providing the necessary heat energy to melt the powdered silicon 14. Although a variety of heating devices can be utilized for heater 13, heater 13 of the preferred embodiment is an electrical flash heater having heating elements disposed in an elongated fashion proximally about the exterior of the vertical portion of crucible 12.

As configured, quartz drum dispenser 11 is positioned onto the upper flanged opening 20 of crucible 12. A reduced friction lining 16 is provided along the flanged area and disposed so that drum 11 fits snugly upon lining 16. The drum 11 is positioned tightly relative to the crucible 12 such that a pressure tight fitting is maintained between dispenser 11 and crucible 12. The lining 16 provides for a reduced friction surface in order for quartz drum 11 to be rotated in relation to crucible 12. In the preferred embodiment a tetrafluoroethylene polymer, such as TEFLON TM (TEFLON is a registered trademark of E. I. Dupont de Nemours and Co.), is used for lining 16. It is to be noted that mechanisms for coupling the drum 11 onto crucible 12 to form the pressure tight seal is not shown in the drawing, but a variety of prior art coupling means can be readily adapted to provide this function. In the practice of the present invention, crucible 12 is held mechanically in place within a chamber and the drum 11 is mechanically held in place by a rotating shaft. Furthermore, means for rotating the dispenser is not shown also because a variety of prior art means can be readily adapted to rotate dispenser 11, such as a motor. In the preferred embodiment a central rotating shaft 18 coupled to one end of the drum 11 provides for the rotating movement of drum 11.

Also coupled to the upper portion of crucible 12, proximal to the flanged area 20, is a gas line 23 having an opening 24 to the interior of crucible 12. The purpose of gas line 23 is to feed in a selected gas to the interior confines of the crucible at predetermined times.

In operation, drum 11 is filled with a high-purity silicon powder or granules 14. One example of such a silicon material for use with the present invention is the silicon spherules commercially distributed by Ethyl Corporation of Baton Rouge, La.

It is to be appreciated that any doping of the bulk silicon can be achieved at the time of manufacture of the silicon powder or, alternatively, the doping is achieved subsequently to the manufacture of the bulk silicon but prior to the introduction of the bulk silicon 14 to apparatus 10.

Once the bulk silicon 14 is loaded into dispenser 11, the whole apparatus 10 is placed in a selected gas ambient environment. Although a variety of inert gases can be utilized, the preferred embodiment utilizes an argon gas ambient. During loading of silicon 14, the slotted opening 15 is in a closed position. That is, the slot 15 is not facing the interior of the crucible. Then the rotary drum 11 is rotated so that the silicon 14 is gravity dispensed through opening 15 into crucible 12. For a given size opening 15, the amount of silicon 14 to be dispensed can be controlled by controlling the time period opening 15 is kept open. It is to be noted that the opening 15 can be made to dispense the silicon 14 by rotating the opening 15 to a stationary open position, rotating the drum 11 continuously, or by a "back and forth" movement.

As the silicon granules 14 ar dispensed into crucible 12, heater 13 is energized to melt the silicon 14. Once a molten silicon 17 pool starts to form at the bottom of the crucible 12, it will cause subsequent silicon powder 14 to melt upon contact. The granulated silicon 14 is dispensed into crucible 12 until a predetermined level 26 is reached. This predetermined level 26 is located below opening 24. One of a variety of prior art monitoring techniques is used to monitor the level of the molten silicon 17, particularly the upper level 26 and a lower threshold level 27. The preferred embodiment utilizes an optic sensor to detect when the level of the molten silicon 17 reaches the upper level 26. In order to prevent the molten silicon 17 from being released through opening 25 of casting nozzle 22, the pressure from the gas supply 23 is reduced so that the external gas pressure at nozzle 22 is sufficient to balance the internal pressure exerted by the molten silicon at nozzle 22.

Once the molten silicon 17 reaches the upper level 26, the drum 11 is rotated to close opening 15. That is, opening 15 is positioned adjacent to lining 16 so that silicon 14 cannot be further dispensed into the crucible 12. With the level of molten silicon 17 at level 26, the apparatus 10 is now in a condition for the casting of the silicon wafer. A gas, preferably the same gas as the ambient, is fed to crucible 12 by gas line 23 through opening 24, thereby increasing the pressure in the region of the crucible above the level of the molten silicon 17. This pressure is continually increased as molten silicon 17 pours from opening 25 to compensate for loss of "hydrostatic head" in the melt as its level drops below level 26.

In mathematical terms, the silicon granules 14 undergo a temperature transformation from $T_O$ (temperature at ambient) to $T_1$ (temperature of molten silicon 17) due to the introduction of heat energy provided by heaters 13.

$T_O$ is established as:

$$T_O = T_M - xC°$$

where $T_M$ is the melting point of silicon, which is approximately 1412 C.°, and x is an arbitrary constant.

$T_1$ is defined as:

$$T_1 = T_M + yC°$$

where y is also an arbitrary constant.

$T_O$ is maintained at a temperature range of 1000° to 1100 C.° in order to readily melt the silicon granules 14 with minimum heat energy input. $T_1$ is maintained 10° to 20 C.° above $T_M$ in order to permit rapid cooling and solidification once the molten silicon 17 is released.

Figure 2:
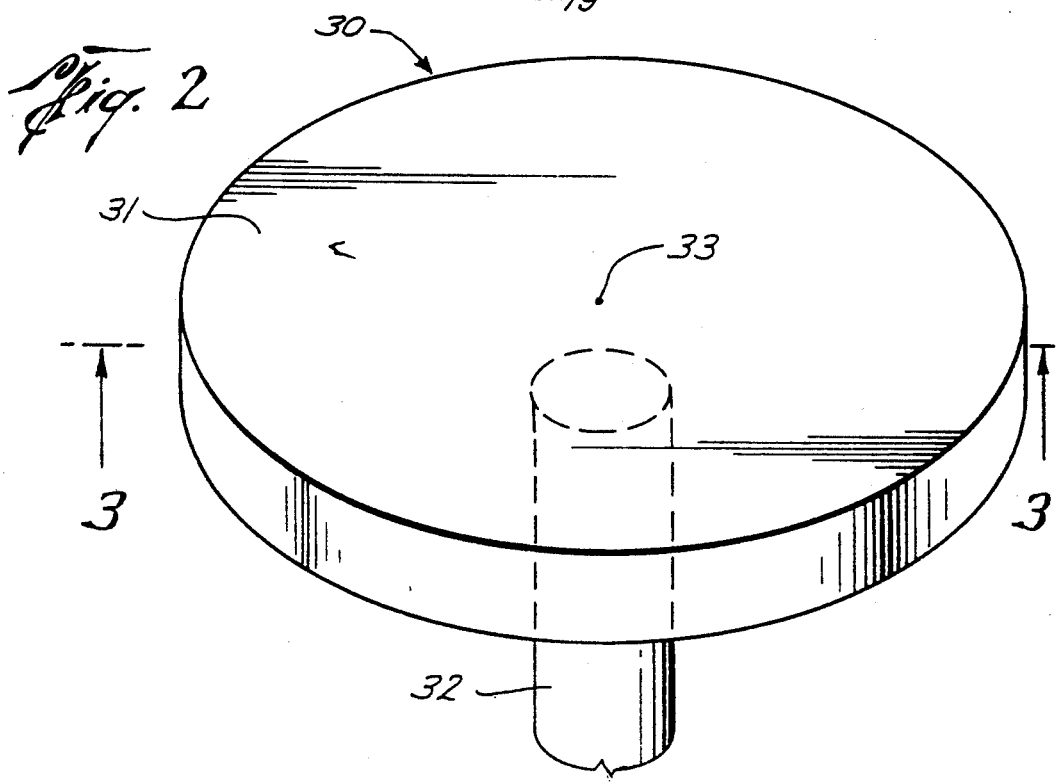
FIG. 2 shows a wafer chuck to be used with the apparatus of FIG. 1 for forming a single silicon wafer.

Referring to FIGS. 2 and 3, a basic chuck 30 for casting a silicon wafer is shown. Wafer chuck 30 is similar to a variety of prior art wafer chucks which are utilized to have the wafer disposed thereon for various kinds of semiconductor processing. Chuck 30 has a flat upper surface 31 which is circular in shape. A shaft 32 extends from the underside of chuck 30. In the prior art, wafer chucks are utilized for having the manufactured silicon wafer disposed thereon for the subsequent processing of the wafer to fabricate the integrated circuit devices thereon. In the instant case, the chuck 30 is utilized to have a silicon wafer formed thereon by casting the molten silicon 17.

Referring to FIGS. 1, 2, and 3, once the molten silicon is available for pouring from crucible 12, the casting nozzle 22 is placed over the center 33 of chuck 30. Chuck 30 is rotated as the pouring sequence commences to cast the silicon wafer. As the pressure above level 26 is increased within crucible 12, the molten silicon 17 is controllably forced out of opening 25 of nozzle 22. As the molten silicon 17 pours out of nozzle 22, the position of the nozzle 22 is moved away from the center 33 of chuck 30 as shown by arrow 34 in FIG. 3. It is to be noted that the relative motion of the nozzle toward the outer perimeter of chuck 30 can be achieved by either moving the chuck in relation to a stationary nozzle or in the alternative, moving the apparatus 10 in relation to a stationary (but rotating) chuck 30. With the precise control of the rotation of the chuck 30, the relative motion of the nozzle 34 from center 33 toward the perimeter of chuck 30, and the uniform flow rate of the molten silicon 17 from nozzle 22, a substantially planar, circular silicon wafer is formed on the upper surface 31 of chuck 30.

The apparatus 10 is designed to provide a certain predetermined amount of molten silicon 17 to be cast onto chuck 30, that amount being dependent on the size, diameter and thickness of the wafer desired. As designed, the casting process is completed when the molten silicon reaches the lower level 27 in the crucible. At this point, the gas pressure above the molten silicon 27 stops increasing, thereby stopping the outflow of silicon 17. It is to be noted that the lower level 27 is maintained above the upper portion of the U-tube 21, in order to maintain a molten silicon 17 barrier. That is, the ambient gas at opening 25 will not enter the crucible (except, possibly just at the nozzle 22) thereby maintaining the interior of the crucible 12 free of ambient contamination. Although not necessarily required, the preferred embodiment uses auxiliary heaters 19, which are disposed about the U-tube 21, in order to maintain the residual silicon at the preselected temperature $T_1$ and thereby maintaining a molten silicon barrier in the U-tube while also maintaining this silicon in a molten state for subsequent dispensing of granulated silicon for the next casting.

Furthermore, the chuck 30 is provided with some form of a cooling scheme, in order to rapidly cool the molten silicon once it is cast on to the chuck. The use of fluids to cool wafer chucks is well-known in the prior art and provides the preferred approach to cooling chuck 30. The fact that $T_1$ is near $T_M$ allows for the rapid solidification of the molten silicon 17 once cast onto the chuck 30.

Referring to FIG. 4, an alternative technique for forming a single wafer is shown. Instead of the chuck 30 of FIG. 3, an alternative chuck 40 is utilized. Chuck 40 is equivalent to chuck 30, however, a central tube 41 extends through the center shaft and has an opening 42 at the upper surface of chuck 40. Prior to the casting process, a monocrystalline silicon seed 44 is placed at the center of the chuck 40 overlying opening 42. A pressure vacuum within tube 41 causes the seed 42 to be held in position on the surface of chuck 40. Then, when the casting process commences, the nozzle 22 is initially positioned at the outer edge 45 of the seed 42 and the nozzle 22 is relatively moved outward toward the perimeter of chuck 40 to form a substantially flat and circular wafer which has a monocrystalline seed embedded at its center. The shape of the seed is not critical to the formation of the wafer, however, the preferred embodiment uses a circular seed to provide for concentricity when the molten silicon is poured.

Although the chuck 30 of FIG. 3 can be used to cast the wafer, chuck 40 of FIG. 4 is preferred for use with the present invention. More than likely, the poured silicon will have a polysilicon crystal structure. This is so because the commercially available silicon powders are polysilicon in form. However, because a monocrystalline wafer is desired as a substrate material, it is preferred to use the seed 44 to form the wafer on chuck 40, so that the seed 44 can be used to regrow the cast wafer into monocrystalline form. One scheme to accomplish this regrowth is described later under a separate heading.

Figure 5:
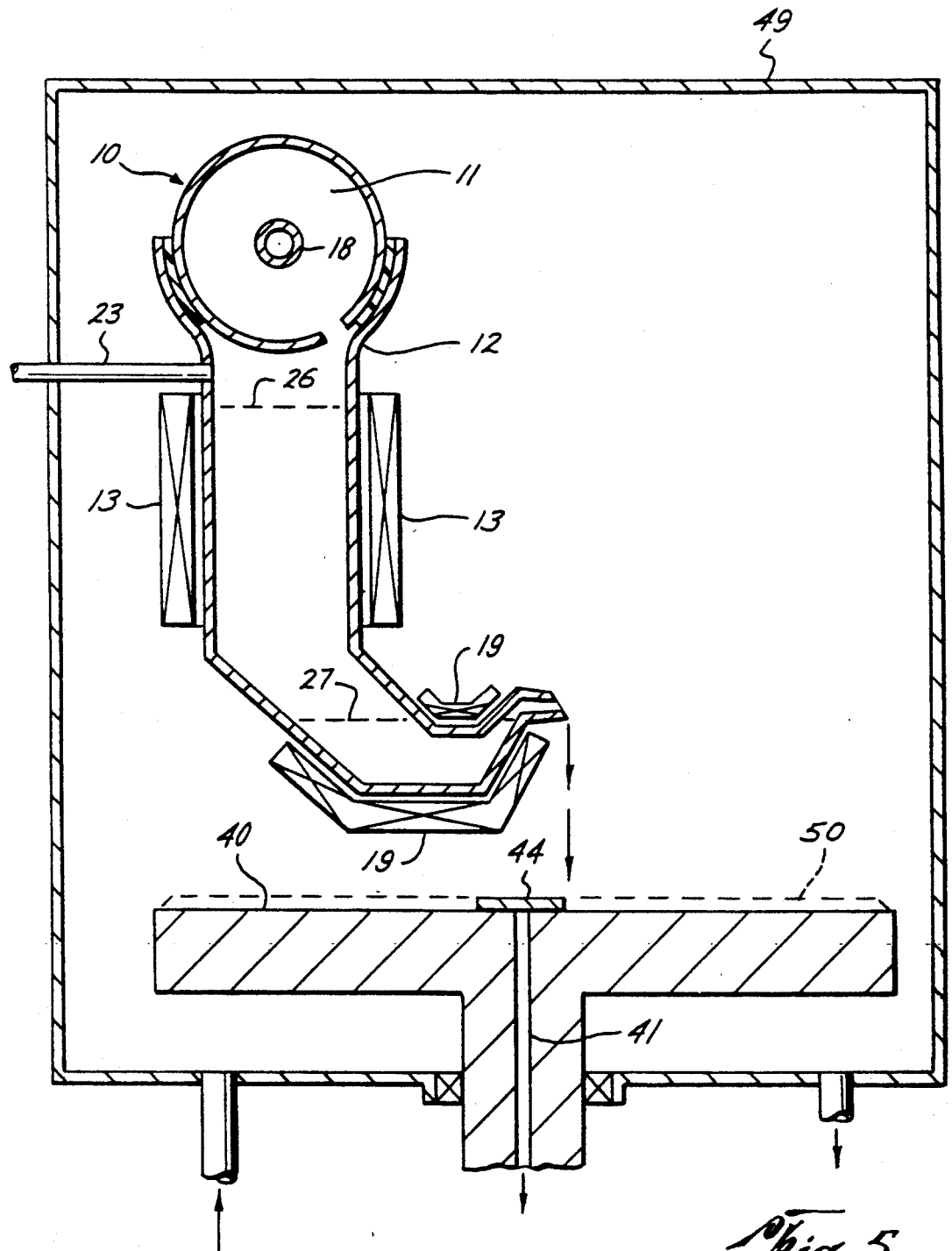
FIG. 5 is a cross-sectional diagram showing the apparatus of FIG. 1 and the wafer chuck of FIG. 4 as utilized in a wafer fabrication chamber.

Referring to FIG. 5, it shows the apparatus 10 and chuck 40 in a chamber 49, in which chamber 49 the ambient environment is defined. The molten silicon is cast from a moving apparatus 10 onto a rotating chuck 40 according to the above described technique to form wafer 50 on chuck 40.

Although the design of the apparatus depends on the size of the silicon wafer to be manufactured, as well as other processing specifications, one example embodiment is described below. Drum 11 is fabricated from quartz material and is 8-10 centimeters (cm) in diameter and about 2 cm wide. Drum 11 is precision ground on the exterior having a single discharge slot 15. One end of drum 11 is coupled to a central axle 18 for rotating drum 11. The other end of drum 11 is coupled to a central feeding tube for replenishment of the silicon powder 14. In this manner, measured amounts of silicon powder 14 can be fed into drum 11 to replenish drum 11 for each separate casting. In an alternative scheme, instead of a central feeding tube, opening 15 is rotated to a position above the upper lip of the crucible, wherein silicon granules are fed into this exposed opening 15 through a funnel-shaped feeding hopper. The upper end of the crucible 12 is 2-3 cm in diameter and approximately 10 cm long. The crucible 12 is manufactured from quartz and the lining 16, which fits between the upper end of crucible 12 and drum 11 is made of TEFLON ™.

Heater 13 is an electrical heater designed to keep the full crucible 12 above the melting point of silicon, with power ratings in the order of approximately one kilowatt (kw). An auxiliary heater 19 is disposed approximate to the U-shaped region 21 of the crucible 12 in order to maintain the liquid silicon reservoir in the U-shaped region in the liquid form. The argon ambient is kept at one atmosphere or less. Chuck 40 is made from quartz and is fluid cooled. The control pressure of the gas above the molten silicon and the molten silicon 17 in the crucible 12, is regulated in a range below the ambient pressure.

The casting plate 30 and/or 40 can be manufactured by material used to make prior art wafer chucks but quartz is used in the preferred embodiment to withstand thermal shock and reduce contamination. A typical dimension for the chuck and the seed 44 are 22 cm and 2 cm, respectively, for a 200 millimeter (mm) wafer casting.

Furthermore, although not shown in the drawings, monitoring devices, such as electro-optical sensors, wellknown in the prior art, can be readily adapted to provide sensing of the molten silicon in crucible 12. Additionally, other prior art sensors can be readily adapted to measure the temperature and pressure associated with the apparatus, chuck and the chamber as shown in FIG. 5.

Subsequently, by reheating the cast wafer, a monocrystalline structure can be made to occur; the regrowth occurring from the seed outward. Although a variety of techniques may be available, one technique is described below.

Regrowth of Monocrystalline Silicon

Referring to FIG. 6, a spin-cast polysilicon wafer 50 having a central monocrystalline silicon seed is shown disposed atop a regrowth wafer chuck 51. It is to be understood that wafer chuck 51 is utilized after the wafer is cast using the apparatus 10 and chuck 40 of FIG. 5. Chuck 51 is basically of similar shape and configuration as chuck 40, but is a completely different chuck as to its purpose. Chuck 51 is made from quartz, although other materials could be readily used, such as stainless steel. Furthermore, chuck 51 is not flat on its upper surface. The center 53 of chuck 51, as well as the perimeter 54 of chuck 51, are raised slightly higher than the remaining upper surface 56 of chuck 51. A vacuum line 52, which vacuum line is equivalent to the vacuum line 41 of FIG. 5 extends through the shaft of the chuck to open at the center raised portion 53. Vacuum line 52 also extends a number of openings toward a circumferential plenum at the perimeter 54.

When the silicon wafer 50 is placed upon chuck 51, the seed 44 overlies the central raised portion 53 and its vacuum opening of vacuum tube 52. The edges of the silicon wafer 50 are disposed onto the raised perimeter portion 54 and overlies the vacuum openings at the perimeter. Thus, when vacuum is applied, this causes the wafer to be held on to chuck 51 at its center and at its perimeter. When the wafer is placed upon chuck 51, substantially most of the wafer overlies the recessed portion 56 of chuck 51. A plurality of openings 57 are provided along the recessed surface 56, which openings 57 are for the purpose of injecting an inert gas into the space 58 underlying the wafer 50.

Once wafer 50 is held in place upon chuck 51, it is subjected to a heat source to melt wafer 50 in order to regrow the silicon structure into monocrystalline form, starting from the seed. Although a variety of heat sources can be utilized to melt the polysilicon for regrowth, the preferred embodiment utilizes an annular laser beam 62. The annular beam 62 commences from the seed region 60 and expands radially outward 61 toward the perimeter. By controlling the width of the laser beam 62, the width of the molten portion of the wafer 50 can be controlled to a predetermined dimension. The technique for utilizing an annular laser beam is well known in a prior art and one such technique is described in U.S. Pat. No. 3,865,564. Furthermore, the technique of melting polycrystalline silicon to grow monocrystalline material from a seed is also well known in the prior art.

Although a number of publications are available which teach this technique, one in particular is *Zone Melting*; Pfann, William G.; John Wiley and Sons; New York; 1958 and 1966. Also relevant are U.S. Pat. Nos. 2,852,351 and 2,926,075 which teach "continuous zone-refining", as well as "Improved techniques for growth of large-area single-crystal Si sheets over $SiO_2$ using lateral epitaxy by seeded solidification"; Tsaur et al.;

Appl. Phys. Lett., Vol. 39, No. 7; October, 1981; pages 561-563, and "Role of impurities in zone melting recrystallization of 10 μm thick polycrystalline silicon films"; Mertens et al.; J. Appl. Phys. 63(8); Apr. 15, 1988; pages 2660-2668.

During the recrystallization process, inert gas is forced into the recess region 58 in order to provide a bottom support to the molten silicon. Without this gas pressure in region 58 to support the liquid silicon, the molten material would sag into the recessed region 58. The gas pressure is tightly controlled in order to support the liquid silicon, yet not excessive to cause the melted portion to bubble upward. It is appreciated that although the regrowth process can be achieved using a flat chuck such as that shown in FIG. 4, chuck 51 is preferred in order to maintain an inert gas barrier between the liquid silicon and surface 56. By preventing surface contact of the molten silicon to surface 56 of chuck 51, contact contamination and crystal defects are inhibited or prevented.

Once the regrowth process is complete, the wafer 50 can then be removed from chuck 51. This single wafer is equivalent to a single wafer after it is cut from a silicon boule in the prior art CZ process. As with the CZ process, subsequent planarization and/or polishing will be needed to prepare the wafer for semiconductor fabrication. Furthermore, the outer edge of the silicon resting on the chuck at the periphery can be removed, if desired, or used as a "handling margin" for the wafer.

Some of the advantages of the present invention over the prior art are discussed below. One advantage of the present invention lies in its use of silicon powder, which is uniformly of higher purity than CZ silicon. The wafer is cast using "fresh" silicon, whereas in the CZ process the unused silicon must sometimes be recycled. Furthermore, the silicon supply is retained in a molten state for a much shorter period of time than CZ silicon since the holding time in the crucible is kept to a minimum. The CZ process is inherently a batch process, while the present invention is a single wafer process which manufactures the wafer in a much shorter time period. All of this shortened time period for manufacturing the wafer from start to finish reduces the introduction of contamination. Additionally, because slicing is not needed, the present invention avoids wasted silicon due to cutting.

Thus, casting of a single silicon wafer and its regrowth to a monocrystalline substrate is described.

I claim:

1. An apparatus for regrowing a crystalline form of a silicon wafer having a monocrystalline silicon seed resident at its center, wherein a beamed energy source is used to heat said wafer outward from said seed in order to grow said silicon wafer into a monocrystalline form from said seed to other portions of said wafer to form a monocrystalline silicon substrate, comprising:

a chuck for supporting said silicon wafer by having said silicon wafer reside thereon, said chuck having its center and perimeter raised above its upper surface such that said wafer resides on a raised surface of said chuck;

vacuum lines disposed within said chuck and coupled to openings in said chuck at said raised surface for holding said wafer onto said raised surface by vacuum;

said chuck having a plurality of openings along its unraised upper surface for injecting gas to the underside of said wafer such that said wafer does not make physical contact to said unraised upper surface, said injected gas for providing counter-support to the weight of molten silicon when a portion of said wafer is melted, while preventing said molten silicon from physically contacting said chuck in order to inhibit contaminating said monocrystalline silicon substrate.

2. The apparatus of claim 1 wherein said chuck is circular in shape.

3. The apparatus of claim 2 wherein said chuck is fabricated from quartz.

* * * * *

UNITED STATES PATENT AND TRADEMARK OFFICE
CERTIFICATE OF CORRECTION

PATENT NO. : 5,178,840
DATED : January 12, 1993
INVENTOR(S) : Franz T. Geyling

It is certified that error appears in the above-identified patent and that said Letters Patent is hereby corrected as shown below:

Column 5, line 7, "ar" should be --are--.

Signed and Sealed this

Fifth Day of July, 1994

Attest:

BRUCE LEHMAN

Attesting Officer

Commissioner of Patents and Trademarks